(12) United States Patent
Shin et al.

(10) Patent No.: US 10,151,867 B2
(45) Date of Patent: Dec. 11, 2018

(54) METHOD FOR FABRICATING LIGHT CONVERSION MEMBER AND DISPLAY DEVICE INCLUDING THE LIGHT CONVERSION MEMBER

(71) Applicant: Samsung Display Co., Ltd., Yongin-si, Gyeonggi-do (KR)

(72) Inventors: Myeong-ju Shin, Seoul (KR); Seunghwan Baek, Seoul (KR); Yeongbae Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/640,278

(22) Filed: Jun. 30, 2017

(65) Prior Publication Data

US 2017/0299795 A1   Oct. 19, 2017

Related U.S. Application Data

(62) Division of application No. 14/798,983, filed on Jul. 14, 2015, now Pat. No. 9,696,480.

(30) Foreign Application Priority Data

Jan. 13, 2015  (KR) .................. 10-2015-0006122

(51) Int. Cl.
*H01L 33/50*   (2010.01)
*F21V 8/00*   (2006.01)

(52) U.S. Cl.
CPC ............ *G02B 6/0023* (2013.01); *H01L 33/50* (2013.01); *H01L 33/505* (2013.01)

(58) Field of Classification Search
None
See application file for complete search history.

(56) References Cited

U.S. PATENT DOCUMENTS

| 8,294,168 B2 | 10/2012 | Park et al. |
| 2012/0075837 A1 | 3/2012 | Um |
| 2012/0236587 A1 | 9/2012 | Kim et al. |

(Continued)

FOREIGN PATENT DOCUMENTS

| KR | 10-2010-0015662 A | 2/2010 |
| KR | 10-1156096 | 2/2012 |

(Continued)

*Primary Examiner* — Whitney Moore
(74) *Attorney, Agent, or Firm* — Lewis Roca Rothgerber Christie LLP

(57) ABSTRACT

A display devices include: a light source configured to emit first light; a light conversion member configured to convert the first light into second light; and a display panel for displaying an image using the second light, wherein the light conversion member includes: a first unit substrate defined a groove etched by a predetermined depth; a second unit substrate disposed to face the first unit substrate; a first connection member having a closed loop shape surrounding the groove and disposed on the first unit substrate; a second connection member bonded to the first connection member and disposed on the second unit substrate to overlap the first connection member; and a quantum dot member disposed in the groove and configured to receive the first light and configured to convert the first light into the second light.

8 Claims, 10 Drawing Sheets

(56) References Cited

U.S. PATENT DOCUMENTS

2014/0160789 A1    6/2014  Park
2015/0077970 A1*  3/2015  Cha .......................... F21K 9/56
                                            362/84

FOREIGN PATENT DOCUMENTS

| KR | 10-2012-0075015 A | 7/2012 |
|---|---|---|
| KR | 10-2012-0105953 A | 9/2012 |
| KR | 10-1294415 B1 | 1/2013 |

* cited by examiner

METHOD FOR FABRICATING LIGHT CONVERSION MEMBER AND DISPLAY DEVICE INCLUDING THE LIGHT CONVERSION MEMBER

CROSS-REFERENCE TO RELATED APPLICATION

This application is a divisional of U.S. patent application Ser. No. 14/798,983, filed Jul. 14, 2015, which claims priority to and the benefit of Korean Patent Application No. 10-2015-0006122, filed Jan. 13, 2015, the entire content of both of which is incorporated herein by reference.

BACKGROUND OF THE INVENTION

1. Field

The present disclosure herein relates to a display device, and more particularly, to a method for fabricating a light conversion member and a display device including the light conversion member.

2. Description of the Related Art

A display device includes a display panel including a plurality of pixels generating an image and a backlight unit supplying light to the display panel. Pixels disposed in the display panel adjust transmittance of light supplied from the backlight unit to display an image.

Recently, a Light conversion member including quantum dots are being used to enhance efficiency of the light supplied to the display panel. The light conversion member may have a bar shape and be used for an edge type backlight unit. The light conversion member may convert blue light into white light.

A tube having an inner space extending in a direction is used to fabricate the bar type light conversion member. The tube may be made of a glass substrate. The tube has one opened end and the other closed end in the extending direction thereof. A quantum dot resin is filled in the inner space of the tube through the one end of the tube and thus be hardened. Then, the one end of the tube may be closed by a sealing member to fabricate the light conversion member.

Also, according to a general process for fabricating the light conversion member, a plurality of light conversion members may be fabricated at the same time. Thus, a plurality of tubes are disposed on a first glass substrate, and then a second glass substrate is bonded onto the first glass substrate. Then, an operation in which the first and second glass substrates bonded to each other are cut may be performed by using a laser. The plurality of laser conversion members may be separated into an individual light conversion member through the laser cutting method. However, in the laser cutting process, a phenomenon in which a portion of the first and second glass substrates is broken frequently occurs.

SUMMARY

The present disclosure provides a method for fabricating a light conversion member, which is capable of reducing a phenomenon that a glass substrate is broken by a laser cutting, and a display device including the light conversion member.

Embodiments of the inventive concept provide methods for a light conversion member including forming a plurality of grooves etched by a predetermined depth from a top surface to a bottom surface of a first substrate; forming a plurality of first connection members disposed in a first unit area partitioned by each of the grooves and having a closed loop shape surrounding each of the grooves on the top surface of the first substrate; forming a quantum dot member in the groove; forming a plurality of second connection members disposed in each of second unit areas partitioned on a bottom surface of a second substrate; cutting the second substrate along boundaries of the second unit areas; bonding a plurality of second sub substrates cut along the second unit areas to the top surface of the first substrate so as to overlap the first unit areas; connecting the first connection members formed on the first substrate to the second connection members formed on a bottom surface of each of the second sub substrates; and cutting the first substrate along between the second sub substrates to form light conversion members.

In some embodiments, each of the first and second substrates may include a glass substrate.

In other embodiments, each of the first and second connection members may be formed of frit glass fabricated by drying and plastic processing frit paste.

In still other embodiments, the frit glass may have a white color.

In even other embodiments, the groove may have a long side in a first direction and a short side in a second direction and be etched by a predetermined depth in the first substrate.

In yet other embodiments, each of the second sub substrates may have a size greater than a width of the groove and overlaps the first unit area.

In further embodiments, the second connection members may be formed on a bottom surface of each of the second sub substrates so as not to overlap the groove.

In still further embodiments, the forming of the quantum dot member may include filling a resin and a quantum dot resin including a plurality of quantum dots accommodated in the resin into each of the grooves; and curing the quantum dot resin.

In even further embodiments, the second substrate may be cut into the second sub substrates by a first laser, wherein each of the sub substrates is formed based on the second unit area and overlaps the first unit area.

In yet further embodiments, the first laser may be a CO2 laser.

In much further embodiments, the forming of the light conversion members may include irradiating the first laser between the second sub substrates to cut the first substrate.

In still much further embodiments, the bonding of the first connection members to the second connection members may include irradiating a second laser downward from top surfaces of the second sub substrates to the second connection members, wherein the second connection members are hardened by the second laser.

In even much further embodiments, the second laser may be an ultraviolet ray laser.

In yet much further embodiments, the first substrate may be formed in a thickness greater than that of the second substrate.

In much still further embodiments, each of the grooves may have a thickness of about 500 μm or less.

In even still further embodiments, the second sub substrates may be bonded to the top surface of the first substrate according to a predetermined gap.

In other embodiments of the inventive concept, display devices include: a light source emitting first light; a light conversion member converting the first light into second light; and a display panel for displaying an image using the second light, wherein the light conversion member includes: a first unit substrate including a groove etched by a predetermined depth; a second unit substrate disposed to face the first unit substrate; a first connection member having a closed loop shape surrounding the groove and disposed on the first unit substrate; a second connection member bonded to the first connection member and disposed on the second unit substrate to overlap the first connection member; and a quantum dot member disposed in the groove to receive the first light to convert the first light into the second light, wherein the first and second connection members are formed of frit glass.

In some embodiments, each of the first and second unit substrates may include a glass substrate, wherein the first unit substrate has a thickness greater than that of the second unit substrate.

In other embodiments, the second unit substrate may have a width greater than that of the groove to overlap the first unit substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Figure 1A:
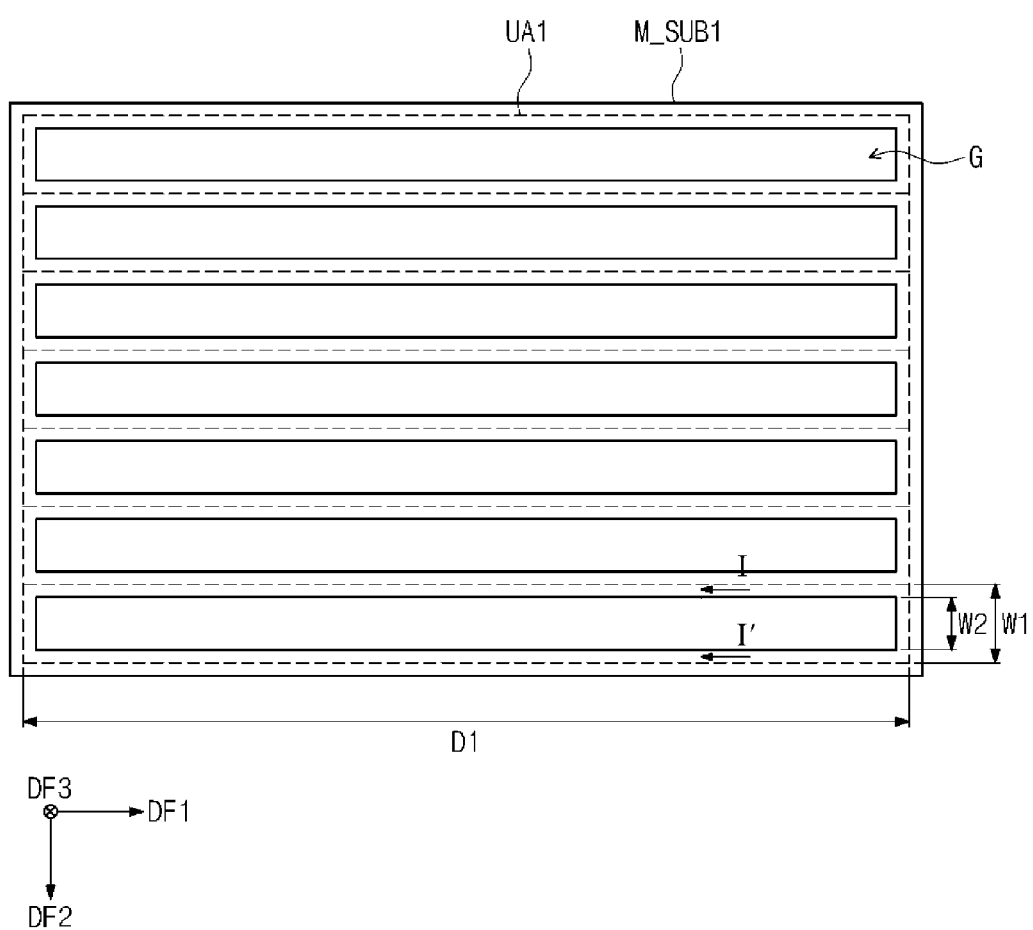
FIGS. 1A to 1D are views for explaining a method for fabricating a first mother substrate of a light conversion member according to an embodiment of the inventive concept.

Hereinafter, specific embodiments will be described in detail with reference to the accompanying drawings. The inventive concept may, however, be embodied in different forms and various modifications and variations can be made in the inventive concept. The inventive concept should not be construed as limited to the embodiments set forth herein and should be understood to be intended to include the structural and functional equivalents of the matter.

Like reference numerals refer to like elements throughout. In the figures, the dimensions of layers and regions are exaggerated for clarity of illustration. It will be understood that although the terms first and second are used herein to describe various elements, these elements should not be limited by these terms. These terms are used only to differentiate one component from another one. For example, without departing from the scope of the inventive concept, a first element could be termed a second element, and similarly a second element could be termed a first element. The terms of a singular form may include plural forms unless referred to the contrary.

The meaning of "include," "comprise," "including," or "comprising," specifies features, integers, steps, operations, elements, components or combinations thereof listed in the specification but does not exclude other features, integers, steps, operations, elements, components or combinations thereof.

FIGS. 1A to 1D are views for explaining a method for fabricating a first mother substrate of a light conversion member LCM according to an embodiment of the inventive concept.

FIG. 1A is a view illustrating a top surface of a first mother substrate used for manufacturing a light conversion member LCM.

Referring to FIG. 1A, a first mother substrate M_SUB1 is prepared. The first mother substrate M_SUB1 may be formed of a light transmitting material. For example, the first mother substrate M_SUB1 may be provided with a glass substrate. The first mother substrate M_SUB1 may have a long side in a first direction DF1 and a short side in a second direction DF2 that perpendicularly intersects the first direction DF1

The first mother substrate M_SUB1 may be partitioned into a plurality of first unit areas UA1. Each of the first unit areas UA1 may be set to correspond to a size of one light conversion member LCM. The first unit area UA1 may be defined as a rectangular shape having a short side W1 in the second direction DF2 and a long side D1 in the first direction DF1.

Also, according to an embodiment, a plurality of grooves G etched by a predetermined depth may be formed in the first mother substrate M_SUB1. The grooves G may be etched downward from a top surface of the first mother substrate M_SUB1 to have a predetermined depth. Each of the grooves G may be formed inside the first unit area UA1. A quantum dot resin may be filled in each of the grooves G. The groove G has a second short side W2 that is shorter than the first short side W1 in the second direction DF2. Also, the plurality of grooves G may be etched according to a variety of depths.

Although seven first unit areas UA1 are illustrated in the first mother substrate M_SUB1 in FIG. 1A, the present disclosure is not limited thereto. That is, the first mother substrate M_SUB1 may be partitioned into seven or more first unit areas UA1 or seven or less first unit areas UA1.

Figure 1B:
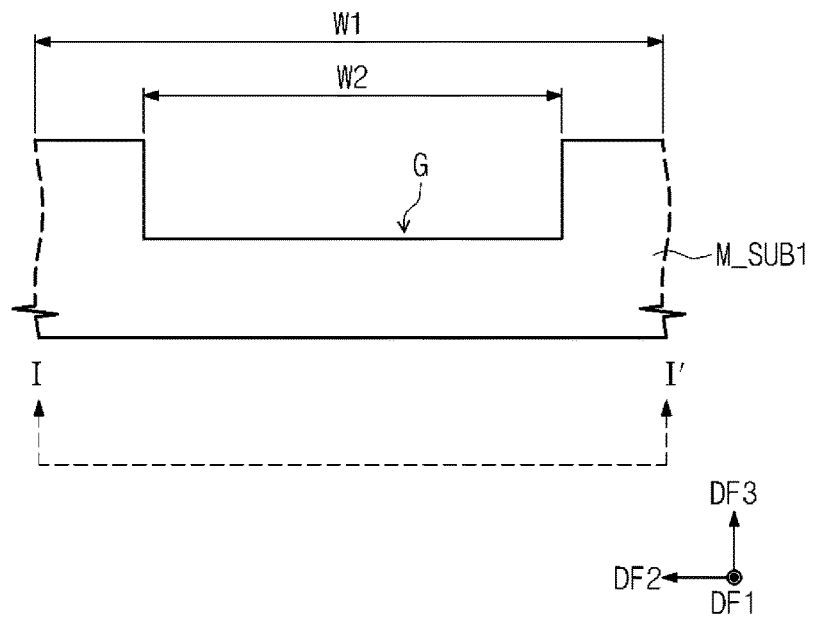
Figure 1C:
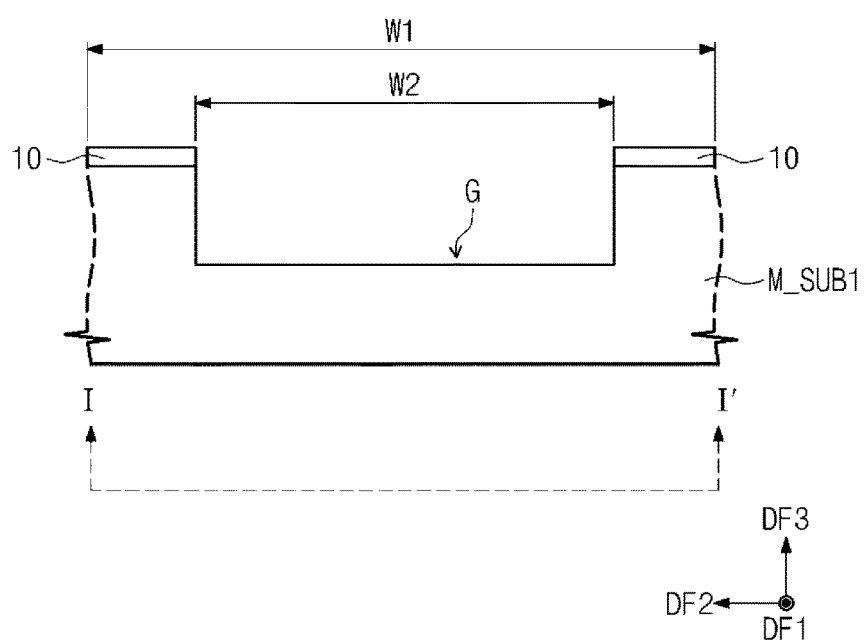
Figure 1D:
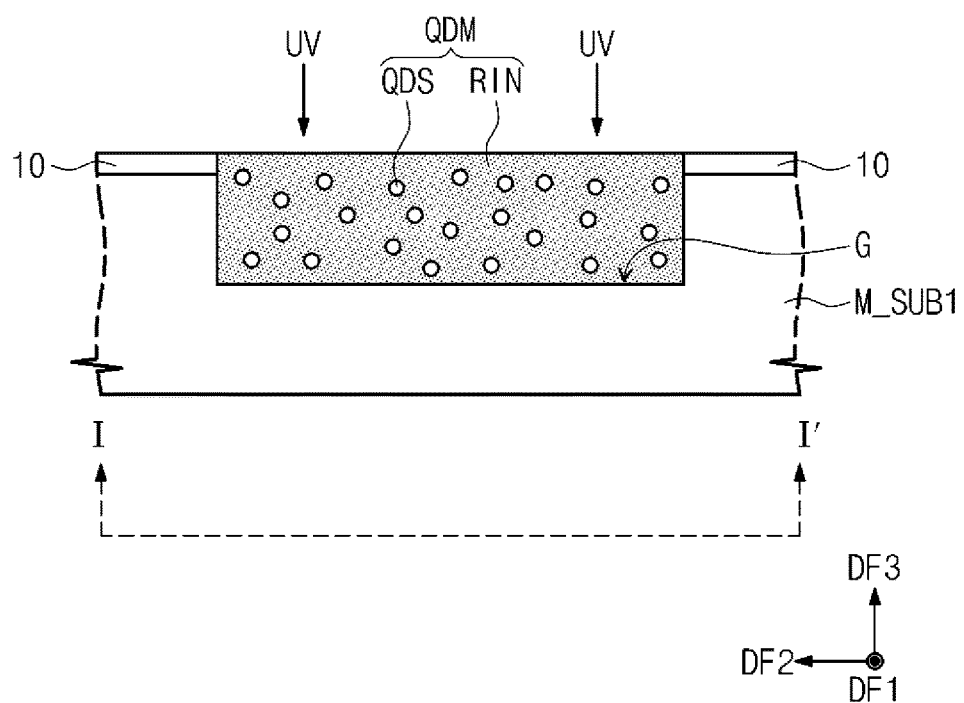

FIGS. 1B to 1D are cross-sectional views taken along line I-I' of FIG. 1A.

In detail, FIG. 1B is a view illustrating a method for fabricating a plurality of grooves G in the first mother substrate M_SUB1. FIG. 1C is a view illustrating a method of forming first connection members on the first mother substrate M_SUB1. FIG. 1D is a view illustrating a method in which the quantum dot resin is filled in each of the grooves G formed in the first mother substrate M_SUB1.

Referring to FIG. 1B, the grooves G may be etched downward from the top surface of the first mother substrate M_SUB1 to have a predetermined depth. For example, the first mother substrate M_SUB1 may be etched by hydrofluoric acid to form the grooves G. According to an embodiment, the first mother substrate M_SUB1 may have a thickness of about 700 μm and each of the grooves G may have a depth of about 500 μm or less.

Referring to FIG. 1C, first connection members 10 may be formed on the top surface of the first mother substrate M_SUB1, in which the grooves G are not formed. In detail, the first connection members 10 may not overlap the groove G and be formed on the top surface of the first mother substrate M_SUB1 to have a closed loop shape surrounding the groove G.

According to an embodiment, the first connection members 10 may be formed by using frit paste (hereinafter, referred to as an "FP"). The FP may include a plurality of frit powder particles, a plurality of binder particles disposed between the frit power particles, a plurality of filler particles disposed between the frit power particles, and solvent for dissolving the frit power particles, the binder particles, and the filler particles.

According to an embodiment, when the FP is dried at a first temperature, the solvent may be removed. Then, as the FP from which the solvent is removed is plastic-processed at a second temperature that is higher than the first temperature, the binder particles may be removed.

For example, the first temperature may be about 200□ and the second temperature may be about 500□ to about 600□. When the FP is dried at the first temperature and plastic-processed at the second temperature, the frit powder particles in the FP may be bonded to each other by the filler particles. As a result, frit glass may be formed. When plastic-processing is performed, the frit glass may be bonded to the first mother substrate M_SUB1. Also, the frit glass according to the inventive concept may have a white or gray color.

Referring to FIG. 1D, the quantum dot resin may be filled in the groove G formed in the first mother substrate M_SUB1. The quantum dot resin includes a resin RIN and quantum dots QDS accommodated in the resin. The quantum dot resin may be filled up to a top surface of the first connection members 10 disposed on the first mother substrate M_SUB1. The quantum dot resin may be hardened by ultraviolet rays provided from the outside. As a result, the quantum dot resin may be hardened to form quantum dot material (hereinafter, referred to as a "QDM"). The QDM may be filled up to the top surface of the first connection members 10.

FIGS. 2A to 2F are views for explaining a method for fabricating a second mother substrate of the light conversion member LCM according to an embodiment of the inventive concept.

Figure 2A:
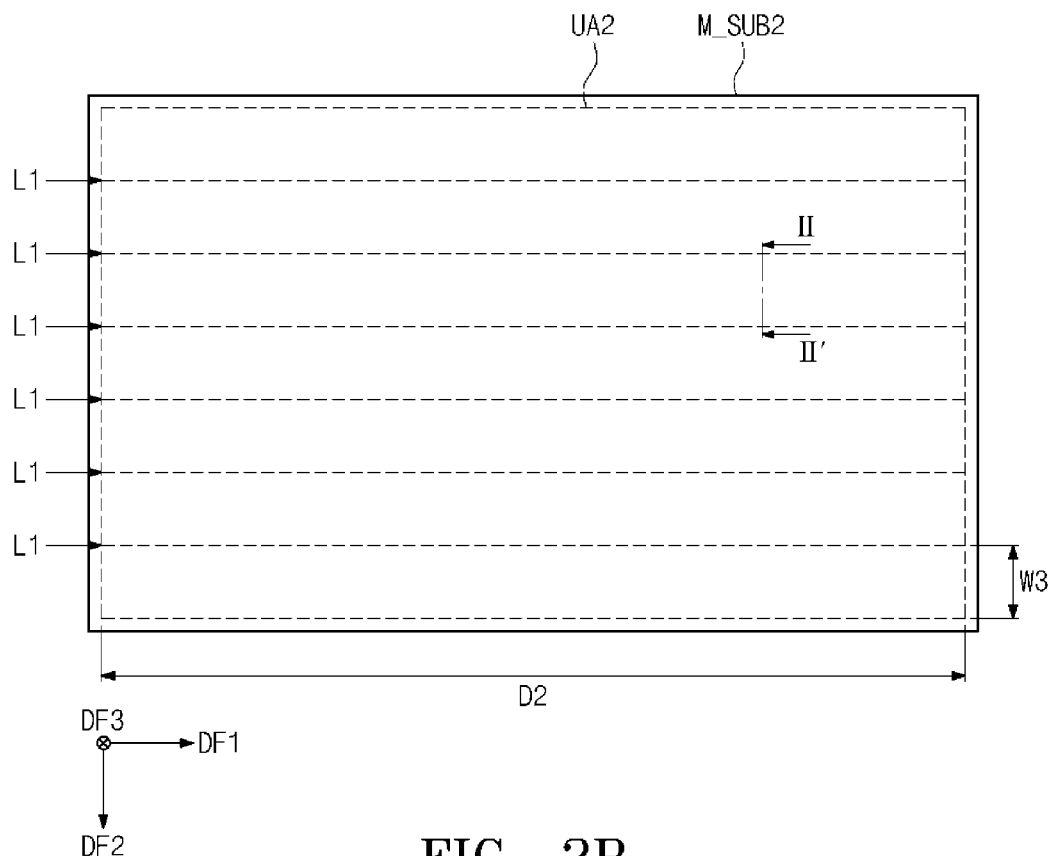
FIGS. 2A to 2F are views for explaining a method for fabricating a second mother substrate of a light conversion member according to an embodiment of the inventive concept.

Referring to FIG. 2A, the second mother substrate M_SUB2 is prepared. The second mother substrate M_SUB2 may be formed of a light transmitting material. For example, the second mother substrate M_SUB2 may be provided with a glass substrate. The second mother substrate M_SUB2 may have a long side in the first direction DF1 and a short side in the second direction DF2 that perpendicularly intersects the first direction DF1. According to an embodiment, the second mother substrate M_SUB2 may have a thickness of about 300 μm.

The second mother substrate M_SUB2 may have a bottom surface which is partitioned into a plurality of second unit areas UA2. Each of the second unit areas UA2 may be defined as a rectangular shape having a third short side W3 in the second direction DF2 and a second long side D2 in the first direction DF1. The third short side W3 may have a length less than that of the first short side W1 of the first unit area UA1 (see FIG. 1). Also, the third short side W3 may have a length greater than that of the second short side W2 of the first unit area UA1. The second long side D2 may have the same length as that of the first long side D1 of the first unit area UA1.

Although seven second unit areas UA2 are disposed on the second mother substrate M_SUB2 in FIG. 2A, the present disclosure is not limited thereto. That is, the second mother substrate M_SUB2 may be partitioned into seven or more second unit areas UA2 or into seven or less second unit areas UA2. The number of the second unit areas UA2 may be equal to that of the first unit areas UA1.

According to an embodiment, the second mother substrate M_SUB2 may be divided into a plurality of second sub mother substrates on the basis of the second unit area UA2. In detail, the second mother substrate M_SUB2 may be cut by a first laser L1. Here, the first laser L1 may be a $CO_2$ laser. As the first laser L1 is irradiated downward onto a boundary surface between the second unit areas UA2 from a top surface of the second mother substrate M_SUB2, the second mother substrate M_SUB2 may be divided into the second sub mother substrates. Each of the second sub mother substrates may have a size that is set to correspond to a size of one light conversion member LCM according to each of the second unit areas UA2.

In general, the first laser L1 may be irradiated after the first mother substrate M_SUB1 and the second mother substrate M_SUB2 are bonded to each other. In this case, a phenomenon that one of the first and second mother substrates M_SUB1 and M_SUB2 is partially broken may occur during a cutting operation by the first laser L1. However, according to the inventive concept, the second mother substrate M_SUB2 may be firstly cut into the second sub mother substrates by the first laser L1. As a result, the number of cutting operation of the first mother substrate M_SUB1 and the second mother substrate M_SUB2 may be reduced. Accordingly, the broken phenomenon according to the cutting operation of the first and second mother substrates M_SUB1 and M_SUB2 may be reduced. As a result, an operation for fabricating the light conversion member LCM may be simplified, and a process yield may be improved.

FIG. 2 is a cross-sectional view taken along line II-II' of FIG. 2A.

Figure 2B:
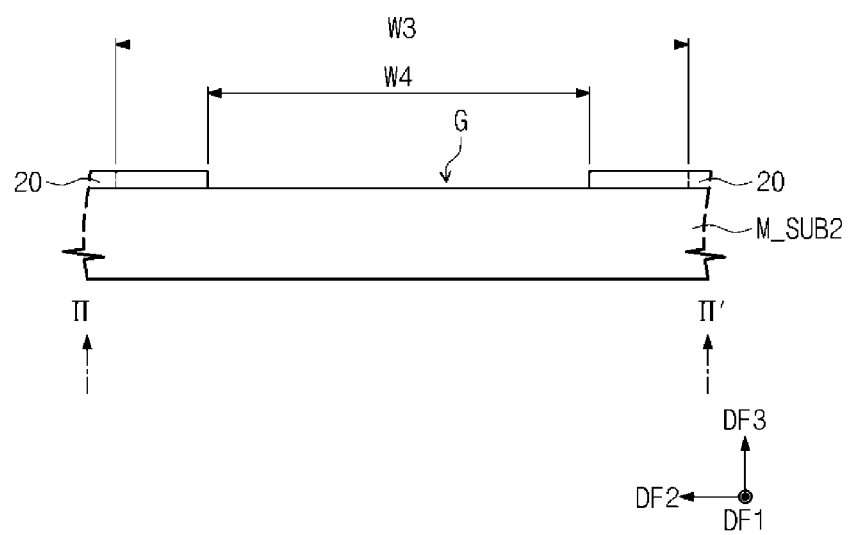

Referring to FIGS. 2A and 2B, a plurality of second connection members 20 formed in each of the second unit areas UA2 may be formed on a bottom surface of the second mother substrate M_SUB2. Here, the bottom surface of the second mother substrate M_SUB2 may be a surface on which the second connection members 20 contact.

In detail, the second connection members 20 may be formed on the bottom surface of the second mother substrate M_SUB2, which does not overlap a fourth short side W4 of the third short side W3 corresponding to the second unit area UA2. Here, the fourth short side W4 may have the same length as that of the second short side W2 that is one side of the groove G. That is, the second connection members 20 may be formed on the bottom surface of the second mother substrate M_SUB2 so as not to overlap the groove G in the first unit area UA1.

The second connection members 20 may be formed of the same material as that of the first connection members (see reference numeral 10 of FIG. 1C) and be fabricated according to the same method as that of the first connection members. Accordingly, a method for forming the second connection members 20 will be omitted.

Each of the second connection members 20 may be formed in a size that is relatively smaller than that of the first connection member 10. That is, when the first mother substrate M_SUB1 and the second mother substrate M_SUB2 are overlappingly disposed, the second connection members 20 may overlap the first connection members 10.

Also, the second connection members 20 include less amount of the filler particles than that of the first connection members 10. In general, when an amount of filler particles is large, the frit glass has a relatively high melting point, improved durability, and a relatively high bonding force. Accordingly, the melting point, durability, and bonding force of the first connection members 10 are higher than those of the second connection members 20. As a result, when the plastic-processing is performed, a bonding force between the first connection members 10 and the first mother substrate M_SUB1 is higher than that between the second connection members 20 and the second mother substrate M_SUB2.

Figure 2C:
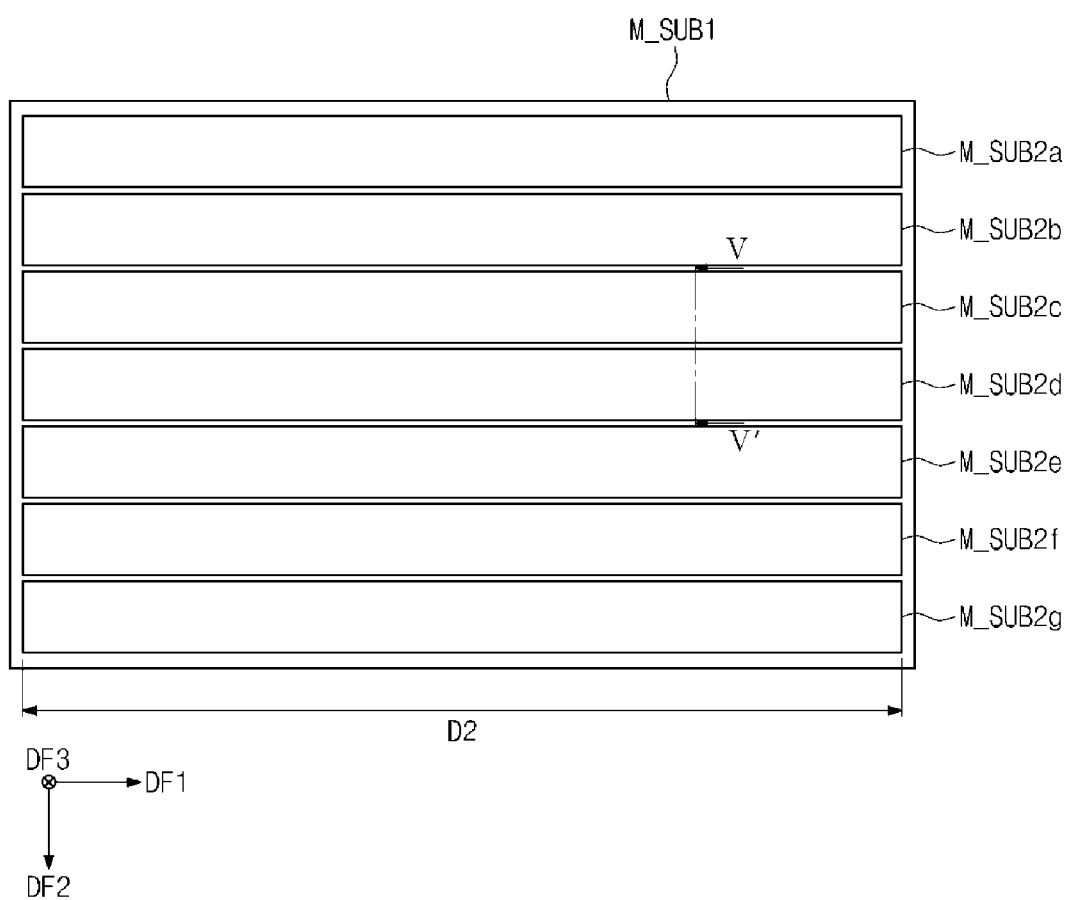

Referring to FIG. 2C, a plurality of second sub mother substrates M_SUB2A to M_SUB2G are provided by laser cutting. According to an embodiment, the second mother substrate M_SUB2 may be divided into a plurality of second sub mother substrates M_SUB2A to M_SUB2G on the basis of the second unit area UA2 by irradiation of the first laser L1. Each of the second sub mother substrates M_SUB2A to M_SUB2G may have a second long side D2 in the first direction DF1 and a third short side W3 in the second direction DF2.

According to an embodiment, each of the second sub mother substrates M_SUB2A to M_SUB2G may be formed in a width greater than a width of the groove G formed in the first mother substrate M_SUB1 in FIG. 1.

Figure 2D:
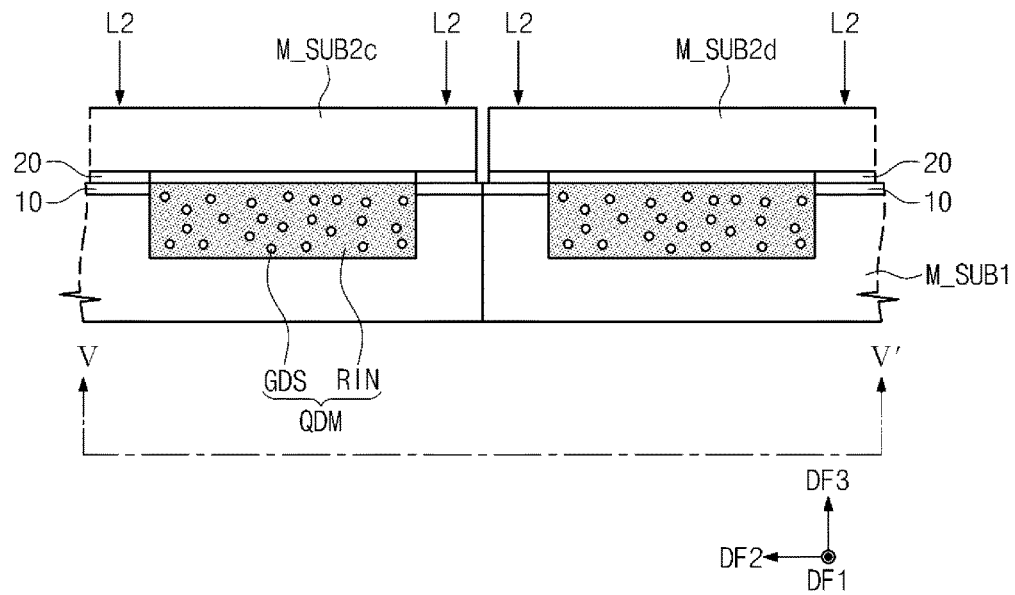
Figure 2E:
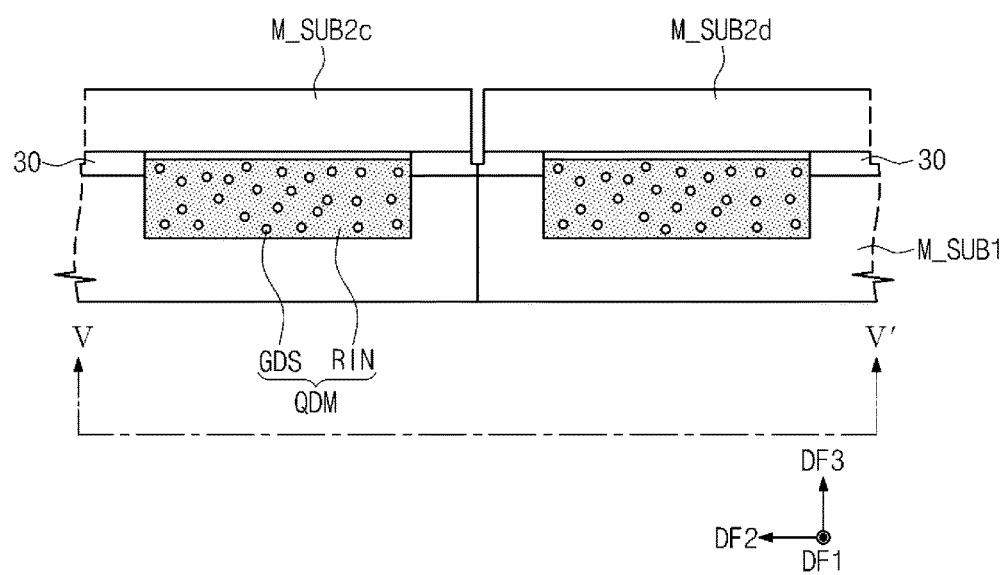
Figure 2F:
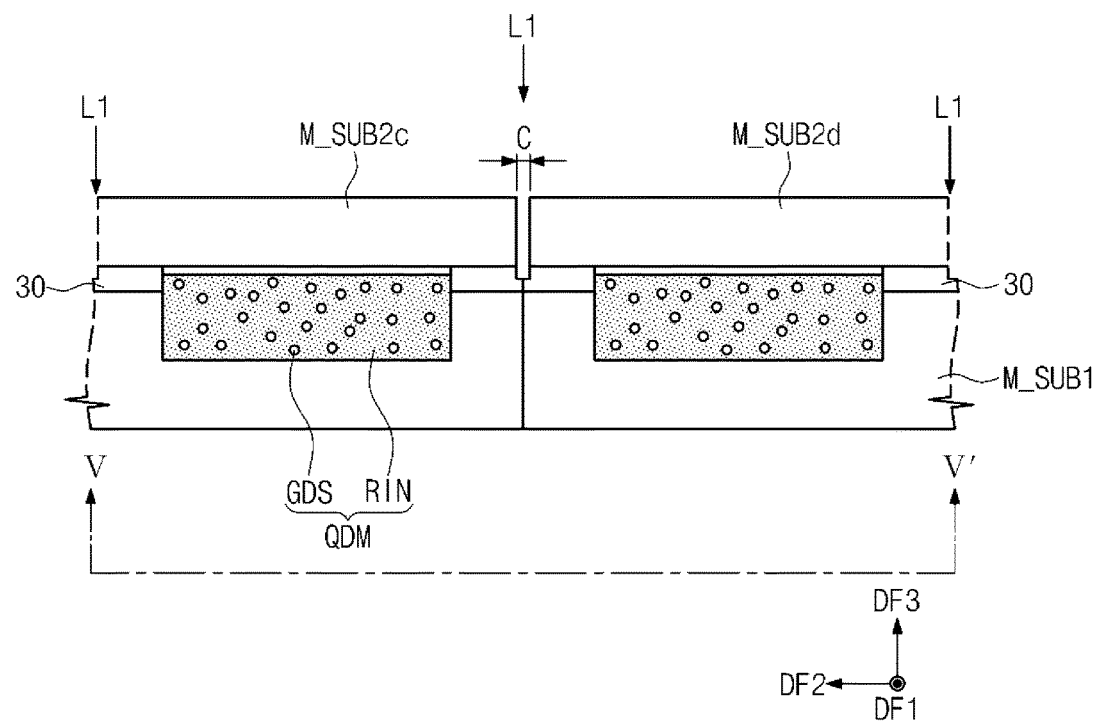

FIGS. 2D to 2F are cross-sectional views taken along line V-V' of FIG. 2C.

Referring to FIG. 2D, two cut third and fourth sub mother substrates M_SUB2C and M_SUB2D are bonded onto the first mother substrate M_SUB1. The cut third and fourth sub mother substrates M_SUB2C to M_SUB2D may be disposed on the first mother substrate M_SUB1 through align matching. The first mother substrate M_SUB1 and the cut third and fourth sub mother substrates M_SUB2C and M_SUB2D may be fixed to each other through magnets. In this case, the magnets may be respectively disposed on a bottom surface of the first substrate M_SUB1 and top surfaces of the second sub mother substrates M_SUB2C and M_SUB2D. As a result, the first mother substrate M_SUB1 and the second sub mother substrates M_SUB2C and M_SUB2D may be fixed to each other.

In detail, the second connection members 20 disposed on the third and fourth sub mother substrates M_SUB2C and M_SUB2D contact the first connection members 10 disposed on the first mother substrate M_SUB1. That is, the second connection members 20 may be disposed to overlap the first connection members 10.

After the first mother substrate M_SUB1 and the cut third and fourth sub mother substrates M_SUB2C and M_SUB2D are fixed to each other through align matching, a second laser L2 may be irradiated onto the second connection members 20. For example, the second laser L2 may be an infrared ray laser. When the second laser L2 is irradiated onto the second connection member 20, the second connection member 20 is hardened to be bonded to the first connection member 10. That is, the second connection member 20 may be momentarily melted and then be bonded to the first connection member 10 while being hardened again.

Also, the second connection member 20 is hardened to be more firmly bonded to the second mother substrate M_SUB2. While plastic-processing is performed, the second connection member 20 may be bonded to the second mother substrate M_SUB2 by a relatively small bonding force in comparison to the first connection member 10. However, since the second connection members 20 is hardened by the second laser L2, the bonding force between the second connection member 20 and the second mother substrate M_SUB2 may increase.

In this case, the first connection member 10 may have a melting point higher than that of the second connection member 20. Accordingly, the first connection member 10 may not be hardened by the second laser L2.

Referring to FIG. 2E, as the second connection member 20 is hardened, the first and second connection members 10 and 20 may be bonded to each other. In this case, as the first and second connection members 10 and 20 are bonded to each other, a third connection members 30 may be formed. That is, the first mother substrate M_SUB1 and the third and fourth sub mother substrates M_SUB2C and M_SUB2D may be bonded to each other by the third connection members 30.

Referring to FIG. 2F, a predetermined gap C may be formed between the third and fourth sub mother substrates M_SUB2C and M_SUB2D. In this case, the gap C between the third and fourth sub mother substrates M_SUB2C and M_SUB2D may be the same as that C between the second sub mother substrates M_SUB2A to M_SUB2G. That is, the gaps C between the second sub mother substrates M_SUB2A to M_SUB2G may be formed during the align matching for disposing the second sub mother substrates M_SUB2A to M_SUB2G on the first mother substrate M_SUB1. For example, although the gaps C are formed between the second sub mother substrates M_SUB2A to M_SUB2G, the gap C may be formed between the second sub mother substrates which are adjacent to each other.

According to an embodiment, the first laser L1 may be irradiated onto the gap C formed between the third and fourth sub mother substrates M_SUB2C and M_SUB2D. The first laser L1 may be irradiated downward from the top surface of the first mother substrate M_SUB1. As a result, the first mother substrate M_SUB1 may be cut by the first laser L1. Similarly, the first laser L1 may be irradiated onto each of the gaps C formed between the two second sub mother substrates which are adjacent to each other. Also, the dimension of the gap C may be modulated variously.

As described above, the first mother substrate M_SUB1 and the second sub mother substrates M_SUB2A to M_SUB2G may be cut along each of the gaps C to form the light conversion members LCM.

Figure 3:
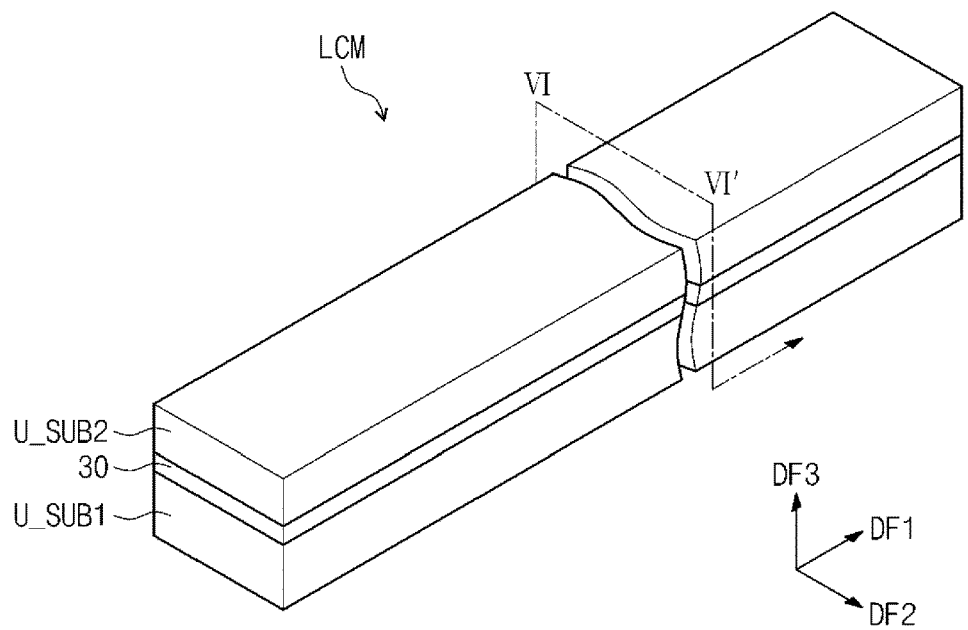
FIG. 3 is a perspective view of a light conversion member fabricated by a method for fabricating a light conversion member according to an embodiment of the inventive concept.
Figure 4:
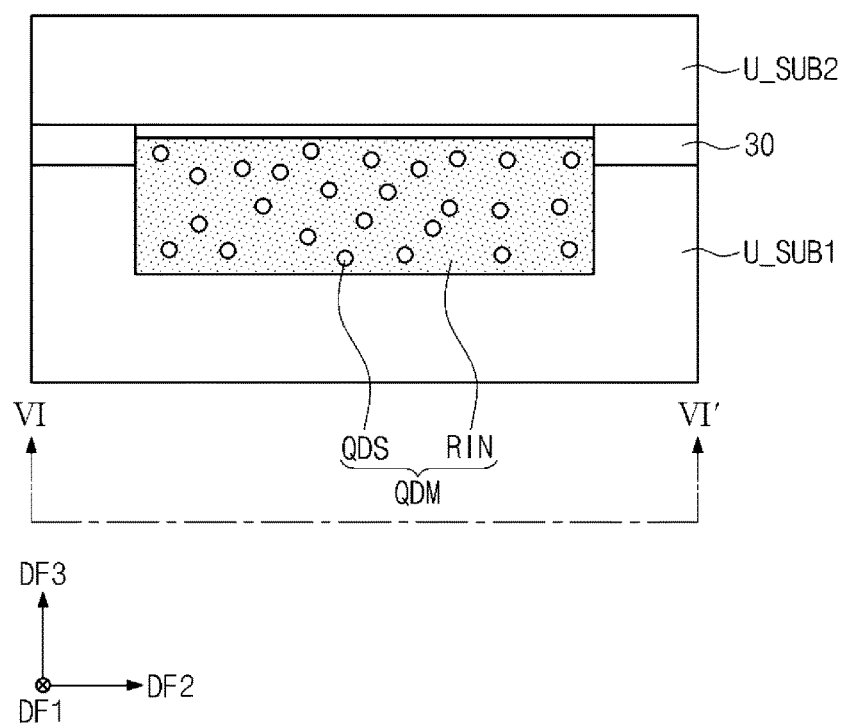
FIG. 4 is a cross-sectional view taken along line VI-VI' of FIG. 3.

FIG. 3 is a perspective view of the light conversion member LCM fabricated by the method for fabricating the light conversion member LCM according to an embodiment of the inventive concept. FIG. 4 is a cross-sectional view taken along line VI-VI' of FIG. 3.

Referring to FIGS. 3 and 4, the light conversion member LCM according to an embodiment of the inventive concept may have a bar shape extending in one direction. Hereinafter, the above-described first and second sub mother substrates M_SUB1 and M_SUB2A to M_SUB2G will be described as a first unit substrate U_SUB1 and a second unit substrate U_SUB2, respectively.

That is, the light conversion member LCM includes the first unit substrate U_SUB1, the second unit substrate U_SUB2, the quantum dot member QDM, and the connection member 30. Each of the first and second unit substrates U_SUB1 and U_SUB2 may be provided with a glass substrate. Also, the connection member 30 may be a frit glass fabricated by drying and plastic processing frit paste.

The first unit substrate U_SUB1 and the second unit substrate U_SUB2 face to each other. The connection member 30 may be disposed between the first unit substrate U_SUB1 and the second unit substrate U_SUB2. Particularly, the connection member 30 is disposed adjacent to a boundary between the first unit substrate U_SUB1 and the second unit substrate U_SUB2.

The quantum dot member QDM may be disposed in a groove formed in the first unit substrate U_SUB1. As illustrated in FIG. 1D, the quantum dot member QDM may include the resin RIN and quantum dots QDS accommodated in the resin RIN. For example, the quantum dot member QDM may convert light emitted from a light source of a backlight unit used for the display device into white light.

The quantum dot member QDM may include the quantum dots which have different sizes according to the kind of light source to generate the white light. For example, when the light source generates blue light, the quantum dot member QDM may include quantum dots QDS absorbing light in a blue wavelength band to output light in a green wavelength band and quantum dots QDS outputting light in a red wavelength band.

The quantum dots QDS of the quantum dot member QDM may absorb the blue light emitted from the light source to convert the blue light into light in the green or red wavelength band. Also, a portion of the blue light may not be absorbed into the quantum dots QDS. Accordingly, the light in the blue, green, or red wavelength band are mixed with each other in the quantum dot member QDM to generate white light.

Figure 5:
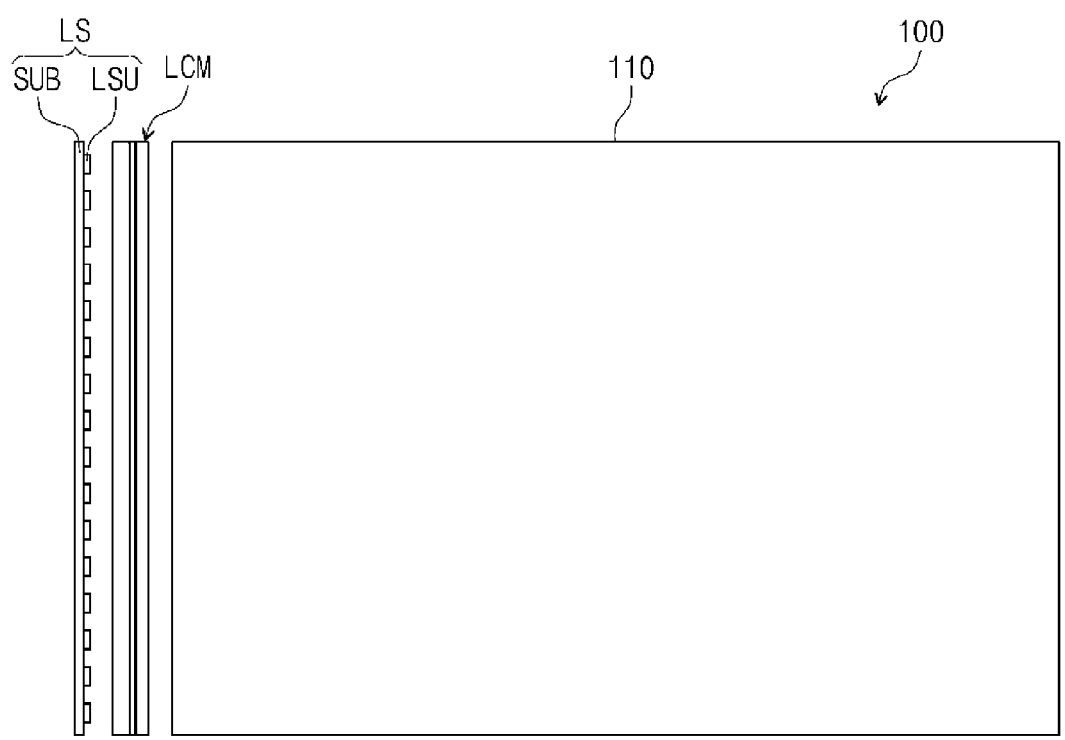
FIG. 5 is an upper plan view of a display device including the light conversion member according to an embodiment of the inventive concept.
Figure 6:
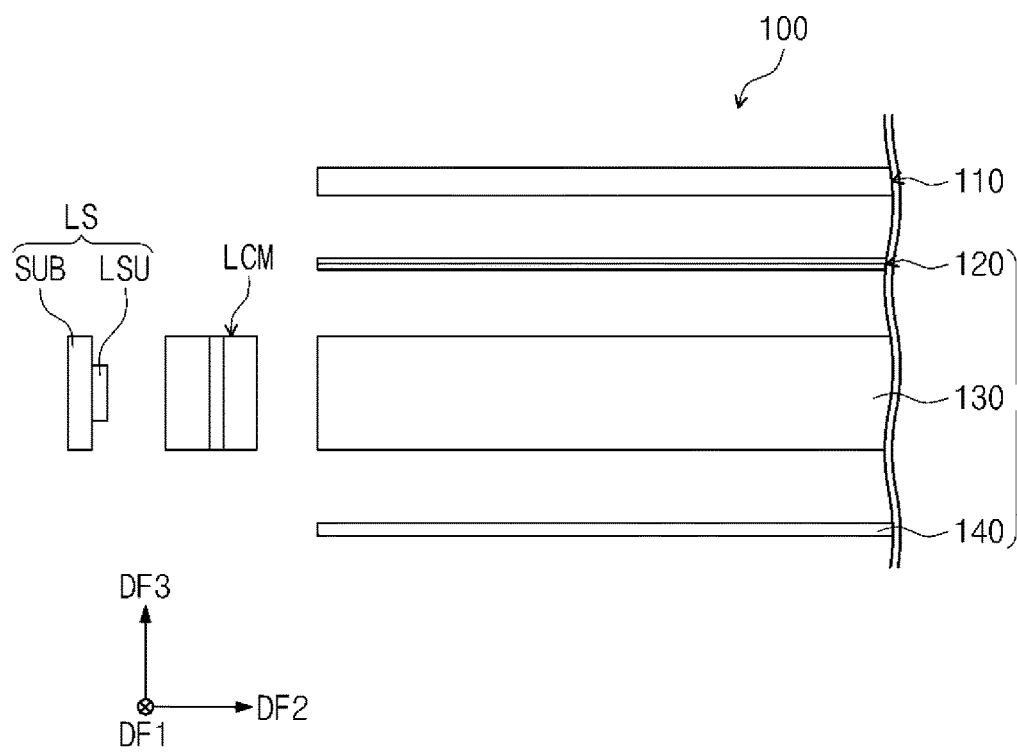
FIG. 6 is a side view of the display device including the light conversion member according to an embodiment of the inventive concept.

FIG. 5 is an upper plan view of the display device including the light conversion member LCM according to an embodiment of the inventive concept. FIG. 6 is a side view of the display device including the light conversion member LCM according to an embodiment of the inventive concept.

Referring to FIGS. 5 and 6, the display device 100 includes a display panel 110 displaying an image using light and a backlight unit BLU generating light to supply the light to the display panel 110. According to an embodiment, the backlight unit BLU is an edge type backlight unit.

The display panel 110 includes a plurality of pixels displaying an image by using light.

The backlight unit BLU may include a light source LS, a light conversion member LCM, a plurality of optical sheets 120, a light guide plate 130, and a reflection plate 140.

The light source LS is adjacent to a side of the light guide plate 130. The light conversion member LCM is disposed between the light source LS and a side of the light guide plate 130. The reflection plate 140 is disposed under the light guide plate 130, and the optical sheets 120 are disposed above the light guide plate 130. The display panel 110 is disposed above the optical sheets 120.

The light source LS includes a substrate SUB and a plurality of light source units LSU which are mounted on the substrate SUB. The light source units LSU may be a blue LED that generates blue light.

The light source units LSU of the light source LS may generate blue light to supply the blue light to the light conversion member LCM. The light conversion member LCM may convert the blue light into white light to supply the white light to the light guide plate 130.

The light guide plate 130 changes a progress direction of the light supplied to a side thereof so that the light is transmitted upward from a bottom surface of the display panel 110. The optical sheets 120 may be disposed on the bottom surface of the display panel 110. The reflection plate 140 reflects the light emitted from a lower portion of the light guide plate 130 to an upper direction.

The optical sheets 120 include a diffusion sheet (not shown) and a prism sheet (not shown) disposed on an upper portion of the diffusion sheet. The diffusion sheet may diffuse the light supplied from the light guide plate 130.

The prism sheet may collect the light diffused by the diffusion sheet in an upper direction that is perpendicular to a plane. The light passing through the prism sheet may vertically advance to have uniform brightness distribution and be supplied to the display panel 110.

According to an embodiment of the inventive concept, the number of laser cutting operation for dividing the first and second substrates which are bonded to each other into the light conversion members may be reduced. As a result, the phenomenon in which the first and second substrates are broken during the cutting operation may be reduced. Also, process yield according to the light conversion member manufacturing may be improved.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:
1. A display device comprising:
a light source configured to emit first light;
a light conversion member configured to convert the first light into second light; and
a display panel configured to display an image using the second light,
wherein the light conversion member comprises:
 a first unit substrate having a groove etched by a predetermined depth;
 a second unit substrate disposed to face the first unit substrate;
 a first connection member having a closed loop shape surrounding the groove and disposed on the first unit substrate;
 a second connection member bonded to the first connection member and disposed on the second unit substrate to overlap the first connection member; and
 a quantum dot member disposed in the groove and configured to receive the first light and configured to convert the first light into the second light.

2. The display device of claim 1, wherein each of the first and second unit substrates comprises a glass substrate, wherein the first unit substrate has a thickness greater than that of the second unit substrate.

3. The display device of claim 1, wherein the second unit substrate has a width greater than that of the groove to overlap the first unit substrate.

4. The display device of claim 1, wherein each of the first and second connection members is provided with a frit glass.

5. The display device of claim 4, wherein the frit glass is provided as one of a gray color and a white color.

6. The display device of claim 1, further comprising a light guide plate disposed under the display panel, wherein the light conversion member is disposed between the light source and the light guide plate.

7. The display device of claim 1, wherein the light source generates the first light of a blue color.

8. The display device of claim 1, the groove has a depth of 500 μm or less.

* * * * *